United States Patent
Wang et al.

(10) Patent No.: US 8,604,428 B2
(45) Date of Patent: *Dec. 10, 2013

(54) METHOD OF CONTROLLING PARTICLE ABSORPTION ON A WAFER SAMPLE BEING INSPECTED BY A CHARGED PARTICLE BEAM IMAGING SYSTEM

(75) Inventors: You-Jin Wang, Milpitas, CA (US); Chung-Shih Pan, Palo Alto, CA (US)

(73) Assignee: Hermes Microvision, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/236,108

(22) Filed: Sep. 19, 2011

(65) Prior Publication Data

US 2012/0006984 A1  Jan. 12, 2012

Related U.S. Application Data

(63) Continuation of application No. 12/247,536, filed on Oct. 8, 2008, now Pat. No. 8,110,818.

(51) Int. Cl.
*H01J 37/26* (2006.01)

(52) U.S. Cl.
USPC ........... 250/307; 250/306; 250/309; 250/310; 250/311

(58) Field of Classification Search
USPC ........... 250/491.1, 492.1, 492.22, 492.3, 251, 250/306, 307, 309, 310, 311; 430/296
See application file for complete search history.

(56) References Cited

U.S. PATENT DOCUMENTS

| | | | |
|---|---|---|---|
| 2004/0211899 A1* | 10/2004 | Ezumi et al. | 250/310 |
| 2004/0223286 A1* | 11/2004 | Chu et al. | 361/234 |
| 2009/0032708 A1 | 2/2009 | Nakasuji et al. | |

* cited by examiner

*Primary Examiner* — Nicole Ippolito
(74) *Attorney, Agent, or Firm* — Muncy, Geissler, Olds & Lowe, PLLC (57) ABSTRACT

A method of controlling particle absorption on a wafer sample and charged particle beam imaging system thereof prevents particle absorption by grounding the wafer sample and kept electrically neutral during the transfer-in and transfer-out process.

17 Claims, 5 Drawing Sheets

METHOD OF CONTROLLING PARTICLE ABSORPTION ON A WAFER SAMPLE BEING INSPECTED BY A CHARGED PARTICLE BEAM IMAGING SYSTEM

RELATED APPLICATIONS

This application is a Continuation of application Ser. No. 12/247,536 filed on Oct. 8, 2008 now U.S. Pat. No. 8,110,818.

BACKGROUND OF THE INVENTION

1. Field of the Invention

The present invention relates to controlling particle absorption on a wafer sample, and more particularly to controlling particle absorption on a wafer sample being inspected by a charged particle beam imaging system.

2. Description of the Prior Art

As electronic devices become smaller in size, the processing technique thereof becomes more microscopic. Charged particle beam imaging will likely become one of the critical technologies in advanced semiconductor manufacture. Charged particle beam imaging tools, which include conventional scanning electron microscopes (SEMs) have a much higher resolution than optical tools and are able to detect smaller size defects.

Particles such as dust in atmosphere influence the characteristics or yield of manufactured electronic devices significantly. Due to this, elimination of particles during the manufacturing process is a very important factor. In a microscopic circuit, since the sizes of particles are as large as or even larger than the distance between metal wires, yield (ratio of source material to product) is degraded when particles are adhered to the wafer causing short circuits or other problems.

Conventional methods for removing particles from, for example, a wafer chuck in a testing apparatus include the use of an air gun or nozzle to blow particles away from the chuck. However, this method is only partially effective in removing the particles from the chuck, especially those carrying charges.

Hence, how to control particle absorption on a wafer sample within a charged particle beam imaging system is now urgently needed to target.

Ezumi et al. (U.S.20040211899) disclosed a charged particle beam irradiation method for reducing the focus offset, magnification fluctuation and measurement length error in charged particle beam devices. In claim 11 of Ezumi, there disclosed a holder configured for gripping a sample and constructed to reach electrical ground during measurement of electrical potential. However, Ezumi did not disclose that the wafer sample was grounded.

To be specific, in [0005] of Ezumi, there disclosed that the cause of this static or electrostatic charge may for example be due to a fixed electrical potential from splitting (split polarization) of polarized material within the resist due to friction during applying of the resist coating by a spin coater.

In [0050] of Ezumi, there disclosed that the static electrometer probe measures the voltage of both the wafer and the grounded conveyor arm (also referring to FIGS. 2 and 4) so that a more accurate value can be obtained by calibrating the wafer electrical potential based on the ground potential of the conveyor arm and the static electrometer probe measures the voltage of both the wafer and the grounded conveyor arm so that a more accurate value can be obtained.

FIGS. 2 and 4 of Ezumi are directed for sample electrification measurement, therefore once both of the wafer and the conveyor arm are grounded to be electrically neutral, there would be no potential difference between the wafer and the conveyor arm such that no measurement result can be obtained. Since the wafer and the grounded conveyor arm can not be simultaneously grounded, i.e. both be electrically neutral, for voltage measurement and Ezumi has disclosed a grounded conveyor arm, the wafer sample is not possibly being grounded.

In addition, in FIG. 3 of Ezumi, it needs a distribution function for the electrical potential that was made based on this acquired data to determine a retarding voltage. Therefore, once the wafer sample is grounded, the distribution function and the subsequent procedure for determining the retarding voltage would no longer be needed.

Therefore, what Ezumi taught is directed to measuring the surface electrical potential with a grounded conveyor arm but Ezumi failed to disclose the wafer sample electrically neutral by grounding, and particularly, Ezumi failed to disclose keeping the wafer sample electrically neutral by grounding during transfer-in and transfer-out process. In other words, in the case of wafer samples being thoroughly grounded during transfer-in and transfer-out process, the sample electrification measurement method provided by Ezumi for correcting retarding voltage during measurement using charged particle beam in SEM is no longer needed.

SUMMARY OF THE INVENTION

The present invention is directed to a method of controlling particle absorption on a wafer sample being inspected by a charged particle beam imaging system. The disclosed method prevents particle absorption by grounding the wafer sample to keep it electrically neutral during the transfer-in and transfer-out process of the wafer.

According to an aspect, a method of controlling particle absorption on a wafer sample within a charged particle beam imaging system in an embodiment includes performing a transfer-in process to transfer the wafer sample from a wafer sample storage onto a support member for a charged particle beam imaging, the wafer sample storage being configured for pre-imaging and post-imaging storage of the wafer sample, the support member being configured for supporting the wafer sample thereon during the charged particle beam imaging, the support member being equipped with a securing unit for securing and un-securing the wafer sample on the support member; performing the charged particle beam imaging of the wafer sample; and performing a transfer-out process to transfer the wafer sample from the support member to said wafer sample storage, wherein during the transfer-in and transfer-out process, the wafer sample is kept electrically neutral by grounding the wafer sample.

According to another aspect, a computer readable medium encoded with a computer program for controlling particle absorption on a wafer sample during charged particle beam imaging includes transferring, using a first sample handling member, the wafer sample from a wafer sample storage onto a surface of a pre-aligner, the wafer sample storage being configured for pre-imaging and post-imaging storage of the wafer sample, the pre-aligner being configured for adjusting an angle of the wafer sample; transferring, using the first sample handling member, the wafer sample from the pre-aligner onto a platform of a loading chamber, the loading chamber being configured for preparing the wafer sample for the charged particle beam imaging; picking the wafer sample within the loading chamber using a second sample handling member; transferring, using a third sample handling member, the wafer sample from the second sample handling member onto a surface of a support member disposed within an inspection chamber for supporting the wafer sample thereon during the charged particle beam imaging, the support member being equipped with a securing unit for securing and un-securing the wafer sample on the support member; securing the wafer sample on the support member using the securing unit; performing the charged particle beam imaging of the wafer sample; un-securing the wafer sample; picking the wafer sample from the support member using the third sample handling member; transferring, using the second sample handling member, the wafer sample from the third sample handling member onto the platform of the loading chamber; and transferring, using the first sample handling member, the wafer sample from the loading chamber into the wafer sample storage, wherein at any given time point other than the charged particle beam imaging step, the wafer sample is kept electrically neutral by grounding the first, second and third sample handling members, the pre-aligner, the loading chamber, the support member and the securing unit.

According to yet another aspect, a charged particle beam imaging system of a wafer sample includes a charged particle beam generator, a condenser lens module, a probe forming objective lens module, a charged particle beam deflection module, a secondary charged particle detector module, an image forming module, and a particle contamination controller. The charged particle beam generator is configured for generating a primary charged particle beam; the probe forming objective lens module is configured for focusing condensed the primary charged particle beam into a charged particle beam probe; the charged particle beam deflection module for scanning the charged particle beam probe across a surface of the wafer sample; the secondary charged particle detector module is configured for detecting charged particles generated from the wafer sample surface when being bombarded by the charged particle beam probe, and whereby generating a secondary charged particle detection signal accordingly; and the image forming module electrically coupled with the secondary charged particle detector module for receiving the secondary charged particle detection signal from the secondary charged particle detector module and forming at least one charged particle microscopic image. The particle contamination controller is coupled with a first sample handling member, a second sample handling member and a third sample handling member for transferring the wafer sample, a wafer sample storage for pre-imaging and post-imaging storage of the wafer sample, a pre-aligner for adjusting an angle of the wafer sample, a loading chamber for preparing the wafer sample for the charged particle beam imaging, and a support member disposed within an inspection chamber for supporting the wafer sample thereon during the charged particle inspection, the support member being equipped with a securing unit for securing and un-securing the wafer sample on the support member. The particle contamination controller includes a computer readable medium encoded with a computer program for controlling particle absorption on a wafer sample during charged particle beam imaging. The computer program executes steps including transferring, using a first sample handling member, the wafer sample from a wafer sample storage onto a surface of a pre-aligner, the wafer sample storage being configured for pre-imaging and post-imaging storage of the wafer sample, the pre-aligner being configured for adjusting an angle of the wafer sample; transferring, using the first sample handling member, the wafer sample from the pre-aligner onto a platform of a loading chamber, the loading chamber being configured for preparing the wafer sample for the charged particle beam imaging; picking the wafer sample within the loading chamber using a second sample handling member; transferring, using a third sample handling member, the wafer sample from the second sample handling member onto a surface of a support member disposed within an inspection chamber for supporting the wafer sample thereon during the charged particle beam imaging, the support member being equipped with a securing unit for securing and un-securing the wafer sample on the support member; securing the wafer sample on the support member using the securing unit; performing the charged particle beam imaging of the wafer sample; un-securing the wafer sample; picking the wafer sample from the support member using the third sample handling member; transferring, using the second sample handling member, the wafer sample from the third sample handling member onto the platform of the loading chamber; and transferring, using the first sample handling member, the wafer sample from the loading chamber into the wafer sample storage, wherein at any given time point other than the charged particle beam imaging step, the wafer sample is kept electrically neutral by grounding the first, second and third sample handling members, the pre-aligner, the loading chamber, the support member and the securing unit.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
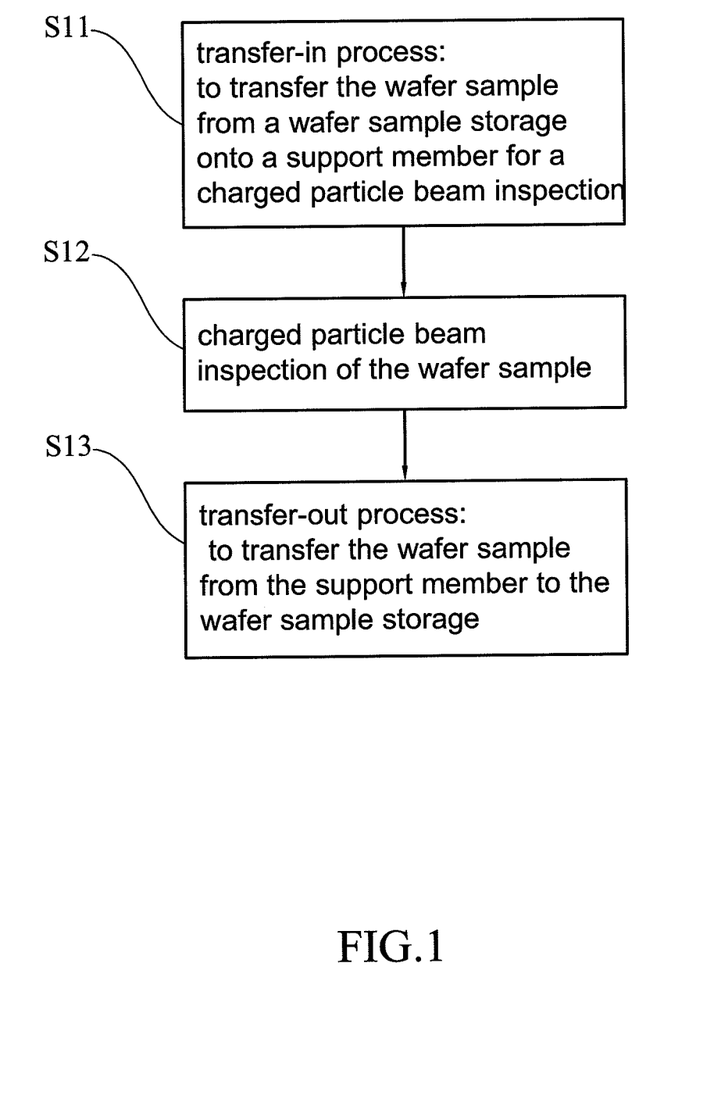
FIG. 1 to FIG. 3 are flow charts illustrating an embodiment of the present invention.
Figure 4:
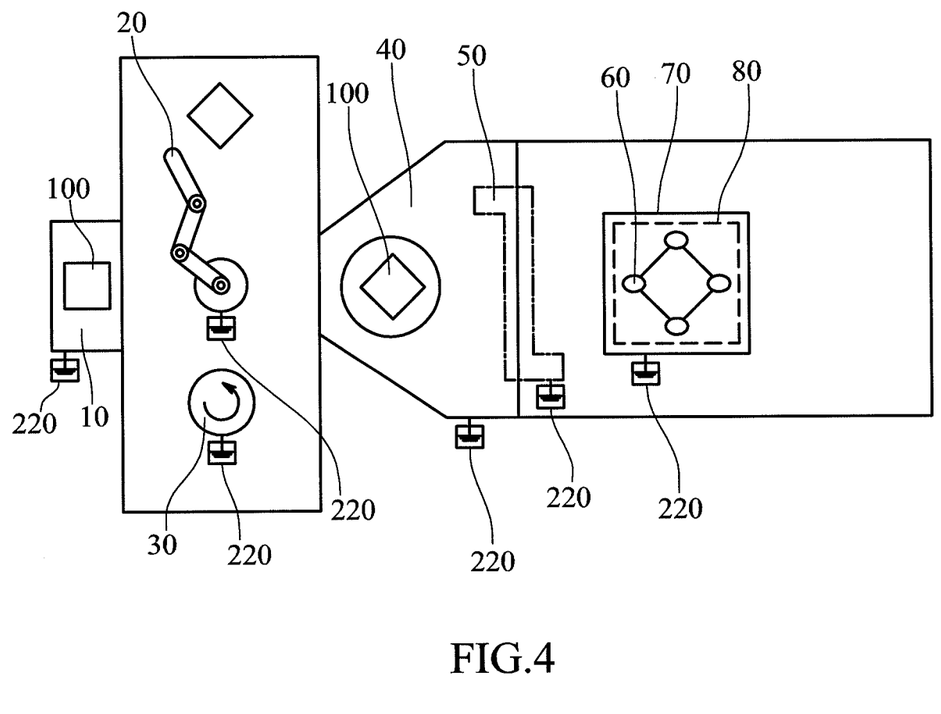
FIG. 4 and FIG. 5 are schematic diagrams illustrating a charged particle beam imaging system of a wafer sample according to another embodiment of the present invention.

Refer to FIG. 1 in conjunction with FIG. 4. FIG. 1 illustrates a flow chart of a method of controlling particle absorption on a wafer sample within a charged particle beam imaging system illustrated in FIG. 4 of an embodiment according to the present invention. FIG. 1 begins with performing a transfer-in process to transfer the wafer sample 100 from a wafer sample storage 10 onto a support member 70 for a charged particle beam imaging (S11), in which the wafer sample storage is configured for pre-imaging and post-imaging storage of the wafer sample 100, the support member 70 is configured for supporting the wafer sample 100 thereon during the charged particle beam imaging, the support member 70 is equipped with a securing unit 80 for securing and un-securing the wafer sample 100 on the support member 70. Next, perform a charged particle beam imaging of the wafer sample 100 (S12). Lastly, perform a transfer-out process to transfer the wafer sample 100 from the support member 70 to the wafer sample storage 10 (S13). It is noted that the wafer sample 100 is kept electrically neutral by grounding the wafer sample 100 during the transfer-in (S11) and transfer-out process (S13).

In one embodiment, the transfer-in process S11 and the transfer-out process S13 include transferring the wafer sample 100 between at least one work chamber using at least one sample handling device, in which the work chamber is configured for preparing the wafer sample 100 for the charged particle beam imaging, or for the charged particle beam imaging step S12 to be performed therewithin. The sample handling device and at least one portion of the work chamber is in contact with the wafer sample 100. This at least one portion of the work chamber is grounded anytime during the transfer-in process S11 and the transfer-out process S13.

Figure 2:
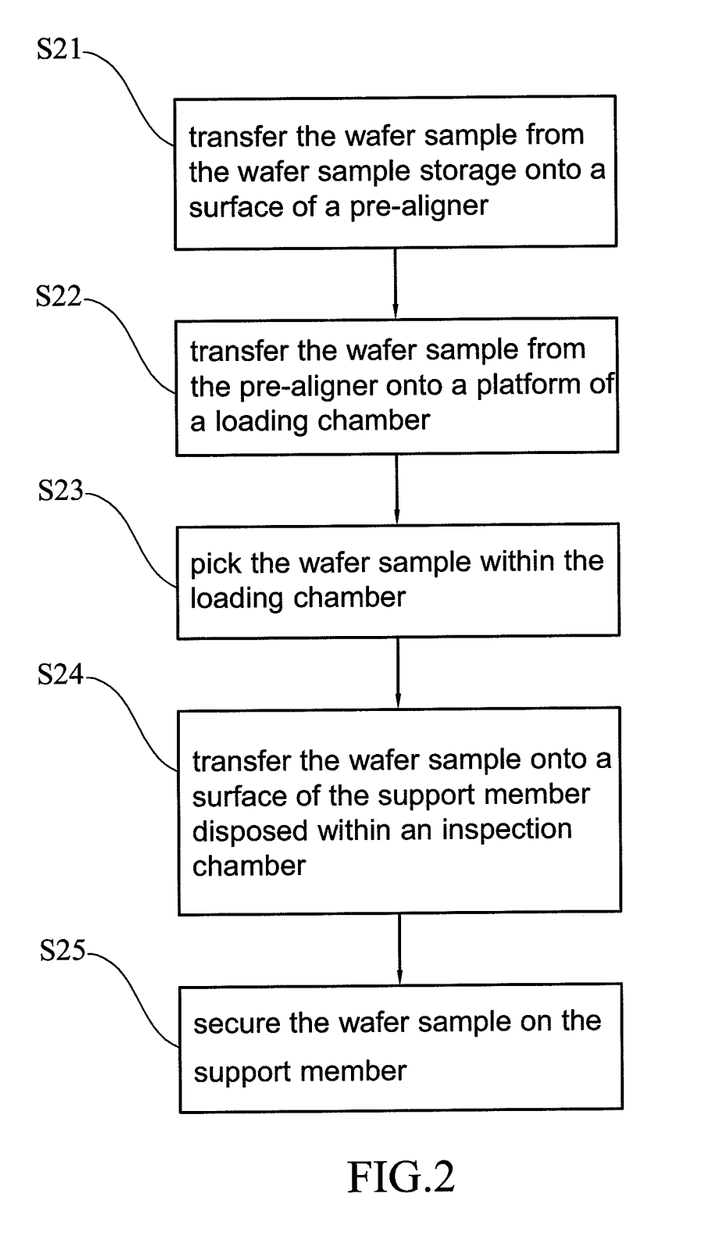

FIG. 2 is a flow chart illustrating the further detailed process of the transfer-in process S11 illustrated in FIG. 1. Referring to FIG. 2 and FIG. 4, the transfer-in process S11 begins with transferring, using a first sample handling member 20, the wafer sample 100 from the wafer sample storage 10 onto the surface of a pre-aligner 30, in which the pre-aligner 30 is configured for adjusting an angle of the wafer sample 100 (S21). Next, transfer, using the first sample handling member 20, the wafer sample 100 from the pre-aligner 30 onto a platform of a loading chamber 40 (S22), in which the loading chamber 40 is configured for preparing the wafer sample 100 for the charged particle beam imaging. The wafer sample 100 is then grabbed by a second sample handling member 50 within the loading chamber 40 (S23), and then picked and transferred from the second sample handling member 50 by a third sample handling member 60 onto the surface of the support member 70 disposed within an inspection chamber (S24). Lastly, the wafer sample 100 on the support member 70 is secured by the securing unit 80 (S25), so as for the charged particle beam imaging step to be performed subsequently. It is noted that the wafer sample 100 is kept electrically neutral by grounding the first, second and third sample handling members(20, 50, 60), the pre-aligner 30, the platform of the loading chamber 40, the support member 70 and the securing unit 80 anytime during the transfer-in process. In a preferred embodiment, any one of the first, second and third sample handling member(20, 50, 60), the pre-aligner 30, the platform of the loading chamber 40, the support member 70 and the securing unit 80 has an electrical resistivity of $10^5$ to $10^9$ ohms-cm, or less than $10^5$ ohms-cm. In an embodiment, the securing unit 80 includes an electrostatic chuck (e-chuck).

Figure 3:
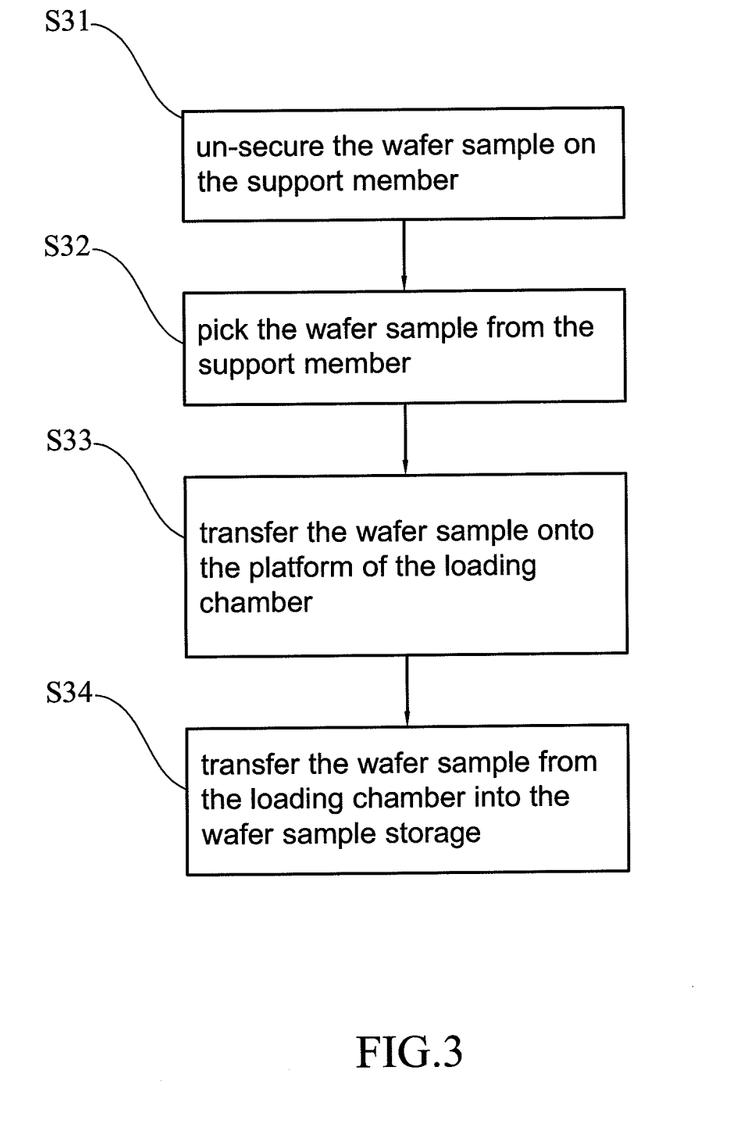

FIG. 3 is a flow chart illustrating the further detailed process of the transfer-out process S13 illustrated in FIG. 1. In transfer-out process S13, the wafer sample 100 on the support member 70 is released or un-secured from the securing unit 80 after the step of the charged particle beam imaging (S31). Next, the wafer sample 100 is picked by the third sample handling member 60 from the support member 70 (S32), transferred to the second sample handling member 50, and then put onto the platform of the loading chamber 40 (S33) by the second sample handling member 50. Lastly, transfer, using the first sample handling member 20, the wafer sample 100 from the loading chamber 40 into the wafer sample storage 10 (S34). It is noted that in the entire transfer-out process the wafer sample 100 is kept electrically neutral all the time by grounding the first, second and third sample handling members(20, 50, 60), the platform of the loading chamber 40, the support member 70 and the securing unit 80. In a preferred embodiment, the first, second and third sample handling members(20, 50, 60), the pre-aligner 30, the platform of the loading chamber 40, the support member 70 and the securing unit 80 have an electrical resistivity of $10^5$ to $10^9$ ohms-cm, or less than $10^5$ ohms-cm. In an embodiment, the securing unit 80 includes an electrostatic chuck (e-chuck).

In an embodiment, the wafer sample storage 10 includes one selected from a group consisting of the following, or any combination thereof: cassette, standard mechanical interface (SMIF), front opening unified pod (FOUP); the first sample handling member 20 includes a robot end effecter; the second sample handling member includes a vacuum arm; the third sample handling member 60 includes at least one projections arranged on the support member 70 and upon which the wafer sample 100 is seated; and the loading chamber 40 includes a load lock.

Figure 5:
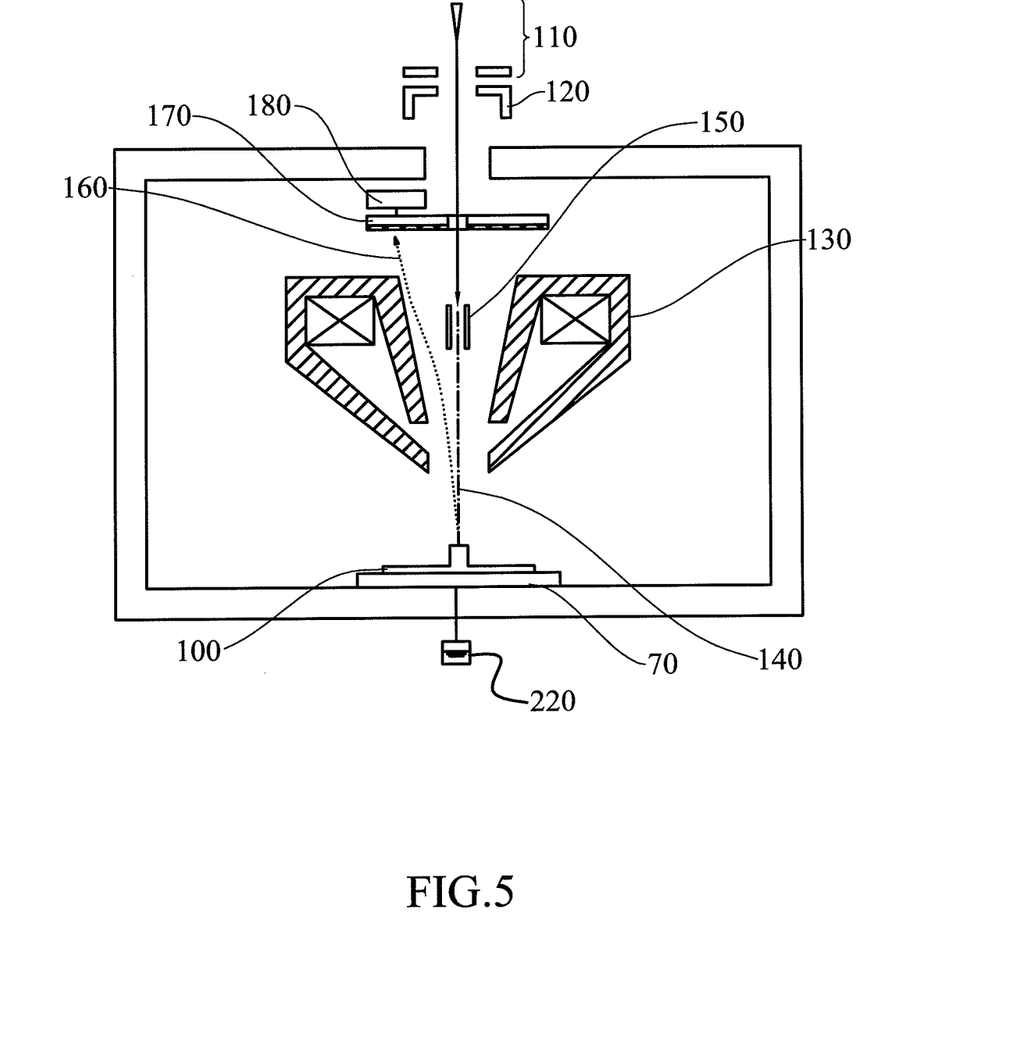

Referring to FIG. 4 and FIG. 5, a charged particle beam imaging system of a wafer sample according to an embodiment of the present invention is illustrated. As shown in FIG. 5, a charged particle beam imaging system includes a charged particle beam generator 110, a condenser lens module 120, a probe forming objective lens module 130, a charged particle beam deflection module 150, a secondary charged particle detector module 170, an image forming module 180, and a particle contamination controller 220.

The charged particle beam generator 110 is configured for generating a primary charged particle beam; the condenser lens module 120 for condensing said primary charged particle beam; the probe forming objective lens module 130 is configured for focusing condensed the primary charged particle beam into a charged particle beam probe 140; the charged particle beam deflection module 150 is configured for scanning the charged particle beam probe 140 across a surface of the wafer sample 100; the secondary charged particle detector module 170 is configured for detecting charged particles 160 generated from the surface of wafer sample 100 when being bombarded by the charged particle beam probe 140, and whereby generating a secondary charged particle detection signal accordingly; and the image forming module 180 electrically coupled with the secondary charged particle detector module 170 is configured for receiving the secondary charged particle detection signal from the secondary charged particle detector module 170 and forming at least one charged particle microscope image.

As shown in FIG. 4, the particle contamination controller 220 is coupled with the first sample handling member 20, the second sample handling member 50 and the third sample handling member 60 for transferring the wafer sample 100, the wafer sample storage 10 for pre-imaging and post-imaging storage of the wafer sample 100, the pre-aligner 30 for adjusting an angle of the wafer sample 100, the loading chamber 40 for preparing the wafer sample 100 for the charged particle beam imaging, and the support member 70 disposed within an inspection chamber for supporting the wafer sample 100 thereon during the charged particle inspection, the support member 70 being equipped with a securing unit 80 for securing and un-securing the wafer sample 100 on the support member 70.

The particle contamination controller 220 includes a computer readable medium encoded with a computer program for controlling particle absorption on the wafer sample 100 during charged particle beam imaging. Referring to FIG. 1 to FIG. 3, the computer program performs the same steps in the above-mentioned embodiment, including steps S21~25, S12, and S31~34.

It is noted that at any given time point other than the charged particle beam imaging step S12, the wafer sample 100 is kept electrically neutral by grounding the first, second and third sample handling members (20, 50, 60), the pre-aligner 30, the loading chamber 40, the support member 70 and the securing unit 80. In a preferred embodiment, the first, second and third sample handling members (20, 50, 60), the pre-aligner 30, the platform of the loading chamber 40, the support member 70 and the securing unit 80 have an electrical resistivity of $10^5$ to $10^9$ ohms-cm, or less than $10^5$ ohms-cm.

In an embodiment, the wafer sample storage 10 includes one selected from a group consisting of the following, or any combination thereof: cassette, standard mechanical interface (SMIF), front opening unified pod (FOUP); the first sample handling member 20 includes a robot end effecter; the second sample handling member 50 includes a vacuum arm; the third sample handling member 60 includes at least one projections upon the wafer sample is seated; and the loading chamber 40 includes a load lock.

To sum up the foregoing descriptions, the present invention controls particle absorption on a wafer sample within a charged particle beam imaging system and is achieved by keeping the wafer sample electrically neutral by grounding the wafer sample all the time except for during the actual inspection.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method of controlling particle absorption on a wafer sample within a charged particle beam imaging system, comprising:

performing a transfer-in process to transfer said wafer sample from a wafer sample storage onto a support member for a charged particle beam imaging, said wafer sample storage being configured for pre-imaging and post-imaging storage of said wafer sample, said support member being configured for supporting said wafer sample thereon during said charged particle beam imaging, said support member being equipped with a securing unit for securing and un-securing said wafer sample on said support member;

performing said charged particle beam imaging of said wafer sample; and performing a transfer-out process to transfer said wafer sample from said support member to said wafer sample storage, wherein during said transfer-in and transfer-out process, said wafer sample is kept electrically neutral by grounding said wafer sample, said support member, said securing unit and said wafer sample storage.

2. The method of claim 1, wherein said transfer-in and transfer-out process comprises transferring said wafer sample between at least one work chamber using at least one sample handling device, said work chamber being configured for preparing said wafer sample for said charged particle beam imaging, or for said charged particle beam imaging step to be performed therewithin.

3. The method of claim 2, wherein said sample handling device and at least one portion of said work chamber are grounded at any given time point during said transfer-in and transfer-out process.

4. The method of claim 3, wherein said at east one portion of said work chamber is in contact with said wafer sample.

5. The method of claim 1, wherein said transfer-in process comprises:

transferring, using a first sample handling member, said wafer sample from said wafer sample storage onto a surface of a pre-aligner, said pre-aligner being configured for adjusting an angle of said wafer sample;

transferring, using said first sample handling member, said wafer sample from said pre-aligner onto a platform of a loading chamber, said loading chamber being configured for preparing said wafer sample for said charged particle beam imaging;

picking said wafer sample within said loading chamber using a second sample handling member;

transferring, using a third sample handling member, said wafer sample from said second sample handling member onto a surface of said support member disposed within an inspection chamber; and securing said wafer sample on said support member using said securing unit, so as for said charged particle beam imaging step to be performed subsequently, wherein at any given time point during said transfer-in process, said wafer sample is caused to be electrically neutral by grounding said first, second and third sample handling members, said pre-aligner, said loading chamber, said support member and said securing unit.

6. The method of claim 5, wherein said first, second and third sample handling members, said pre-aligner, said platform of said loading chamber, said support member and said securing unit have an electrical resistivity of $10^5$ to $10^9$ ohms-cm, or less than $10^5$ ohms-cm.

7. The method of claim 5, wherein said securing unit comprises an electrostatic chuck (e-chuck).

8. The method of claim 5, wherein said transfer-out process comprises:

un-securing, after the step of said charged particle beam imaging, said wafer sample on said support member using said securing unit;

picking said wafer sample from said support member using said third sample handling member;

transferring, using said second sample handling member, said wafer sample from said third sample handling member onto said platform of said loading chamber; and transferring, using said first sample handling member, said wafer sample from said loading chamber into said wafer sample storage, wherein at any given time point during said transfer-out process, said wafer sample is caused to be grounded by grounding said first, second and third sample handling members, said loading chamber, said support member and said securing unit.

9. The method of claim 8, wherein said first, second and third sample handling members, said pre-aligner, said platform of said loading chamber, said support member and said securing unit have an electrical resistivity of $10^5$ to $10^9$ ohms-cm, or less than $10^5$ ohms-cm.

10. The method of claim 8, wherein said securing unit comprises an electrostatic chuck (e-chuck).

11. A method of controlling particle absorption on a wafer sample within a charged particle beam imaging system, comprising:

performing a transfer-in process to transfer said wafer sample from a wafer sample storage onto a support member for a charged particle beam imaging, said wafer sample storage being configured for pre-imaging and post-imaging storage of said wafer sample, said support member being configured for supporting said wafer sample thereon during said charged particle beam imaging, said support member being equipped with a securing unit for securing and un- securing said wafer sample on said support member;

performing said charged particle beam imaging of said wafer sample; and performing a transfer-out process to transfer said wafer sample from said support member to said wafer sample storage, wherein during said transfer-in and transfer-out process, said wafer sample is kept electrically neutral by grounding said wafer sample wherein said transfer-in process comprises:
transferring, using a first sample handling member, said wafer sample from said wafer sample storage onto a surface of a pre-aligner, said pre-aligner being configured for adjusting an angle of said wafer sample;
transferring, using a first sample handling member, said wafer sample from said pre-aligner onto a platform chamber, said loading chamber being configured for preparing said wafer sample for said charges particle beam imaging;
picking said wafer sample within said loading chamber using a second sample handling member; and
transferring, using a third sample handling member, said wafer sample from said second sample handling member onto a surface of said support member disposed within an inspection chamber;
wherein at any given time point during said transfer-in process, said wafer sample is caused to be electrically neutral by grounding said first; second and third sample handling members, said pre-aligner, said loading chamber, said support member and said securing unit.

12. The method of claim 11, further comprising the step of securing said wafer sample on said support member using said securing unit.

13. The method of claim 11, wherein said first, second and third sample handling members, said pre-aligner, said platform of said loading chamber, said support member and said securing unit have an electrical resistivity of $10^5$ to $10^9$ ohms-cm, or less than $10^5$ ohms-cm.

14. The method of claim 11, wherein said securing unit comprises an electrostatic chuck (e-chuck).

15. The method of claim 11, wherein said transfer-out process comprises:
un-securing, after the step of said charged particle beam imaging, said wafer sample on said support member using said securing unit;
picking said wafer sample from said support member using said third sample handling member;
transferring, using said second sample handling member, said wafer sample from said third sample handling member onto said platform of said loading chamber; and
transferring, using said first sample handling member, said wafer sample from said loading chamber into said wafer sample storage,
wherein at any given time point during said transfer-out process, said wafer sample is caused to be grounded by grounding said first, second and third sample handling members, said loading chamber, said support member and said securing unit.

16. The method of claim 15, wherein said first, second and third sample handling members, said pre-aligner, said platform of said loading chamber, said support member and said securing unit have an electrical resistivity of $10^5$ to $10^9$ ohms-cm, or less than $10^5$ ohms-cm.

17. The method of claim 15, wherein said securing unit comprises an electrostatic chuck (e-chuck).

* * * * *